United States Patent
Jaeger et al.

(10) Patent No.: US 8,164,341 B2
(45) Date of Patent: Apr. 24, 2012

(54) SYSTEM AND METHOD TO MEASURE SERIES-CONNECTED CELL VOLTAGES AND VERIFY MEASUREMENT ACCURACY

(75) Inventors: Ronald H. Jaeger, Indianapolis, IN (US); Chad Hartzog, Kokomo, IN (US)

(73) Assignee: EnerDel, Inc., Indianapolis, IN (US)

( * ) Notice: Subject to any disclaimer, the term of this patent is extended or adjusted under 35 U.S.C. 154(b) by 943 days.

(21) Appl. No.: 11/970,102

(22) Filed: Jan. 7, 2008

(65) Prior Publication Data

US 2008/0164882 A1  Jul. 10, 2008

Related U.S. Application Data

(60) Provisional application No. 60/883,795, filed on Jan. 7, 2007.

(51) Int. Cl.
*G01N 27/02* (2006.01)
*H02J 7/00* (2006.01)
*H01M 10/48* (2006.01)
*G08B 3/00* (2006.01)

(52) U.S. Cl. ........ 324/433; 324/145; 320/120; 320/121; 429/90; 429/99; 340/636.1; 340/636.21; 340/644

(58) Field of Classification Search ............... 324/433
See application file for complete search history.

(56) References Cited

U.S. PATENT DOCUMENTS

| | | | |
|---|---|---|---|
| 6,362,627 B1 * | 3/2002 | Shimamoto et al. | 324/434 |
| 7,078,908 B2 * | 7/2006 | Fujita et al. | 324/433 |
| 2004/0041569 A1 * | 3/2004 | Furukawa | 324/433 |
| 2004/0160229 A1 * | 8/2004 | Fujita et al. | 324/607 |
| 2006/0187097 A1 | 8/2006 | Dolazza et al. | |

OTHER PUBLICATIONS

PCT/US 08/00184 International Search Report dated Jun. 20, 2008.

\* cited by examiner

*Primary Examiner* — Yalkew Fantu
(74) *Attorney, Agent, or Firm* — Faegre Baker Daniels

(57) ABSTRACT

A system and method for measuring voltage of individual cells connected in series includes a single flying capacitor. The capacitor stores the charge of one of the cells such that a primary analog-to-digital converter (ADC) connected to the capacitor may process a representation of the voltage of the cell being measured. A secondary ADC is connected directly to the cell being measured. The measurements of the primary and secondary ADCs are then compared to verify the accuracy of the flying capacitor.

11 Claims, 2 Drawing Sheets

SYSTEM AND METHOD TO MEASURE SERIES-CONNECTED CELL VOLTAGES AND VERIFY MEASUREMENT ACCURACY

CROSS REFERENCE TO RELATED APPLICATIONS

This application claims the benefit of U.S. Provisional Application No. 60/883,795 filed Jan. 7, 2007, which is incorporated by reference.

BACKGROUND OF THE INVENTION

1. Field of the Invention

The subject invention relates to a system and method for determining a voltage in each cell of a plurality of battery cells connected in series and verifying the accuracy of the determined voltage.

2. Description of the Related Art

Electric vehicles and hybrid-electric vehicles typically utilize numerous cells (i.e., batteries) for powering electric drive motors and other electric equipment. These cells are often connected together in a series relationship, as is well known to those skilled in the art, to provide higher voltages.

Due to variations between individual cells, such series-connected cells require periodic balancing, i.e., charge equalization, to maintain a steady voltage and prevent premature failure. One difficulty in cell balancing is determining which cell or cells may need to individually charged or replaced. Therefore, it is necessary to provide a system to determine the voltage in each cell.

Numerous systems and techniques have been developed to address this necessity. Prior art systems often utilize one or more capacitors between the cells and the amplifier such that a more stable and accurate voltage may be measured. For instance, U.S. Pat. No. 6,362,627 (the '627 patent) to Shimamoto et al. discloses a system with a plurality of cell switches connected to various cells, a capacitor connected to the cell switches, and an amplifier connected to the capacitor. Japanese Patent Abstract Publication No. 2003240806 (the '806 publication) to Yazaki Corporation discloses a system for measuring voltage of individual cells in a plurality of cells connected in series. The system includes a plurality of cell switches electrically connected to the plurality of cells with one switch connected on each side of each cell.

Unfortunately, cell measurements using capacitor-based prior art systems such as these may not always be accurate due to circuit malfunctions, faults, and device degradation. Said another way, although these problems may be occurring, they may not be reflected in the cell voltage measurement via the capacitor. Therefore, there remains an opportunity for a system and method for measuring voltage of individual cells connected in series having improved accuracy.

SUMMARY OF THE INVENTION AND ADVANTAGES

The subject invention provides a system for measuring voltage of individual cells in a plurality of cells connected in series. The system includes a capacitor for storing a charge of at least one of the cells. At least one switch is electrically connected to the capacitor for selectively connecting at least one of the cells to the capacitor. The system also include a primary analog-to-digital converter (ADC) having an input in communication with the capacitor. The primary ADC receives an analog voltage supplied by the capacitor and converts the analog voltage supplied by the capacitor into primary digital voltage data. The system also includes a secondary ADC having an input in communication with at least one of the cells. The secondary ADC receives an analog voltage supplied by the cell and converts the analog voltage supplied by the cell into secondary digital voltage data.

The subject invention also provides a method of measuring voltage of individual cells in a plurality of cells connected in series utilizing a system including a capacitor, a primary ADC, and a secondary ADC. The method includes the step of electrically connecting one of the cells to the capacitor. The capacitor is then charged for a predetermined charge time. The method also includes the step of converting the analog voltage from the capacitor to a primary digital voltage signal corresponding to the voltage of the capacitor using the primary ADC in response to an elapse of the predetermined charge time. The method further includes the step of converting the analog voltage from one of the cells to a secondary digital voltage signal corresponding to the voltage of the cell using the secondary ADC.

The subject invention provides advantages over the prior art. Specifically, the subject invention provides an accuracy check of the cell voltage received via the capacitor and the primary ADC. More specifically, the secondary ADC allows the controller to verify that the voltage received from the capacitor matches the actual cell voltage. This allows automatic detection of unintended circuit malfunctions, degradation of the capacitor, or other system anomalies that may lead to an inaccurate cell measurement.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Referring to the Figures, wherein like numerals indicate corresponding parts throughout the several views, a system 10 and method 100 for measuring voltage of individual cells 12 in a plurality of cells connected in series is shown. Those skilled in the art realize that a "cell" is commonly referred to as a "battery". However, for purposes of consistency, the term cell 12 shall be used throughout and should not be regarded as limiting in any way.

Figure 1:
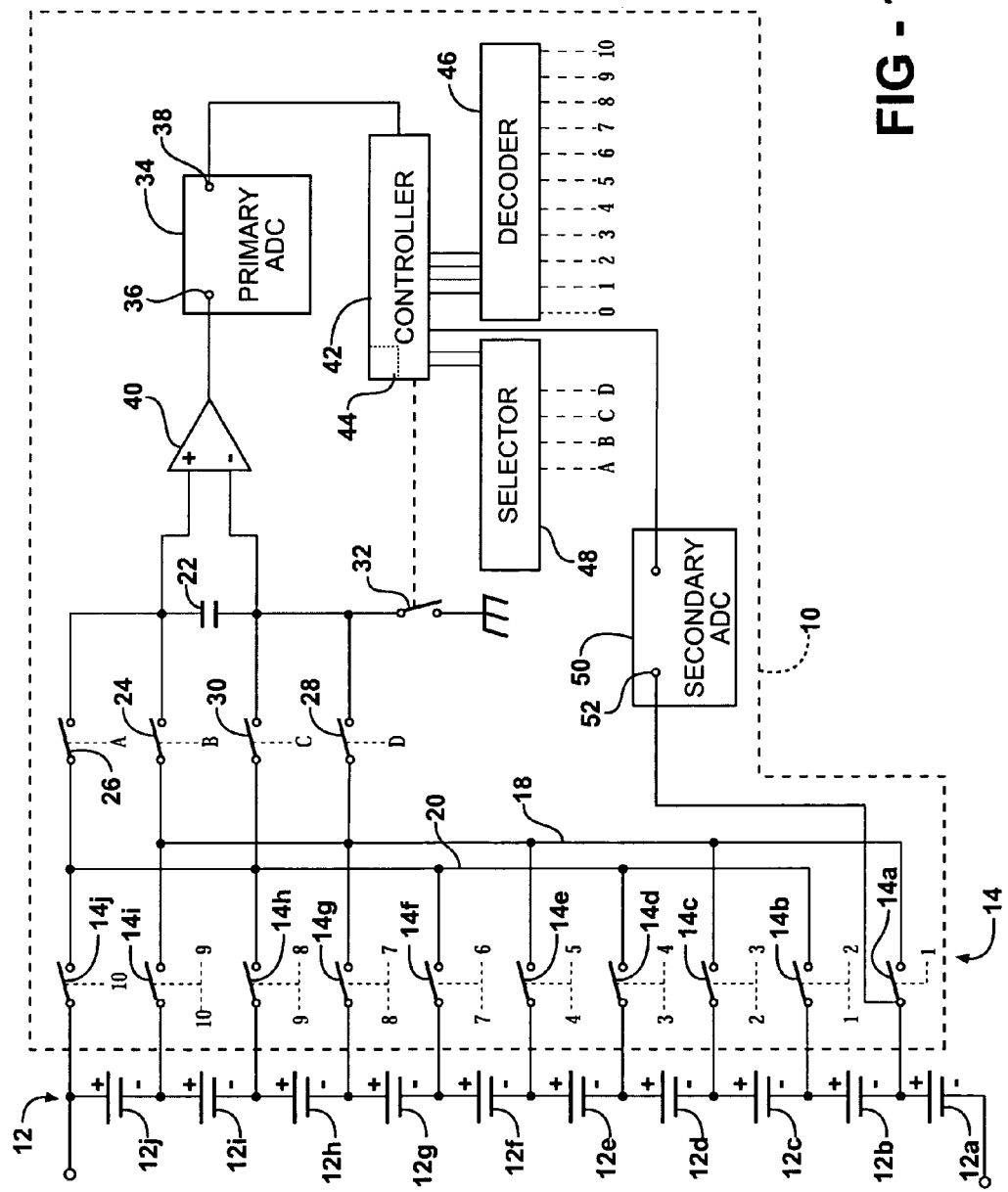
FIG. 1 is a block electrical schematic diagram of an illustrated embodiment of a system of the present invention showing a plurality of cells and the system for measuring a voltage of each individual cell including a flying capacitor, a primary analog-to-digital converter (ADC), and a secondary ADC.

FIG. 1 shows an embodiment of the system 10 of the present invention. Ten cells 12 are connected in series for providing power to an electrical device, such as, but not limited to, an electric vehicle (EV) or hybrid electric vehicle (HEV). Each cell is preferably a lithium cell with a charged voltage of about 4 volts (V), therefore providing a total voltage of about 40 V. Of course, any number, type, or capacity of cells 12 may be utilized with the subject invention, and the use of ten, lithium, 4 V cells 12 in the illustrated embodiment should not be regarded as limiting. Furthermore, the plurality of cells 12 may be used in other applications outside of a vehicle. For purposes of descriptive clarity, the cells 12 are sequentially on the various Figures from the first cell 12A through a tenth cell 12J.

Each cell 12 includes a positive side (i.e., cathode) and a negative side (i.e., anode) as is known to those skilled in the art. The plurality of cells 12 are electrically connected together in series. That is, a positive side of the first cell 12A is electrically connected to a negative side of a second cell 12B, a positive side of the second cell 12B is electrically connected to a negative side of a third cell 12C, and so on. Typically, where the cells 12 are disposed in a vehicle, the negative side of the first cell 12A is electrically connected to a chassis ground, i.e., the metallic frame of the vehicle. However, there may be situations where the negative side of the first cell 12A is electrically isolated from the chassis ground.

Those skilled in the art appreciate that each cell 12 may actually be several physical cells 12 connected in parallel and operating at the same voltage level for increasing the current capacity of the entire plurality of cells 12 connected in series. Moreover, each cell 12 may actually be several physical cells connected in series.

In the illustrated embodiment, the system 10 includes a plurality of cell switches 14. Each cell switch 14 has a first side (not numbered) and a second side (not numbered), such that electrons may flow between the sides when the cell switch 14 is activated. Conversely, electrons are generally prevented from flowing between the sides when the cell switch 14 is deactivated.

Preferably, the cell switches 14 are implemented utilizing transistors, such that the electrical switching performed by the cell switches 14 can be done without moving parts (i.e., a "solid state" implementation). Most preferably, the cell switches 14 are implemented as a pair of metal-oxide-semiconductor field-effect transistors (MOSFETs). Each MOSFET in the pair are preferably a BSS84 P-channel type, which are available from numerous electronics manufacturers. The sources of each MOSFET of the pair are electrically connected together and the gates of each MOSFET are electrically connected together. The drain of one MOSFET acts as the first side of the cell switch 14 and the drain of the other MOSFET acts as the second side of the cell switch 14. The use of MOSFETs, instead of mechanical or relay type switches, greatly reduces implementation cost of the system 10 as well as increases the cycle speed of cell 12 measurement.

However, those skilled in the art realize that each switch could alternatively be implemented with a single MOSFET, a different type of transistor(s), different types of field-effect transistors, a relay, or other suitable switching device. Furthermore, operation of the cell switches 14 (and other switches) herein may be referred to within this application as "opening", "opened", "closed", or "closing", etc., such as is the convention for mechanical type switches. However, this is done for convenience purposes only, and should not be read as limited the cell switches 14 (and other switches) to mechanical type switches.

Preferably, the number of cell switches 14 should equal the number of cells 12 to be measured. Therefore, in the illustrated embodiments, where ten cells 12 are connected in series, ten cell switches 14 are utilized. For purposes of descriptive clarity, the ten cell switches 14 are labeled sequentially from a first cell switch 14A through a tenth cell switch 14I. The first side of each cell switch 14 is electrically connectable to a positive side of one of the cells 12.

Also for purposes of descriptive clarity, the first side of the first cell switch 14A is electrically connected to the positive side of the first cell 12A, the second side of the second cell switch 14B is electrically connected to the positive side of the second cell 12B, and so on. Since the cells 12 are electrically connected in series, the first side of the first cell switch 14A is electrically connected to both the positive side of the first cell 12A and the negative side of the second cell 12B. The same reasoning holds true for the other cell switches 14.

The system 10 may also include a plurality of cell switch operation circuits (not shown). Each cell switch operation circuit is electrically connected to at least one cell switch 14 for activating the at least one cell switch 14. In the illustrated embodiment, each cell switch operation circuit may operate a pair of cell switches 14.

Referring again to FIG. 1, the system 10 of the illustrated embodiment also includes a first bus 18 and a second bus 20. The first bus 18 is formed by electrical connection of every other cell switch 14, i.e., alternating cell switches 14. The second bus 20 is formed by electrical connection of every cell switch 14 not connected to the first bus 18. In the illustrated embodiment, as shown in FIG. 1, the first bus 18 electrically connects the second side of the first, third, fifth, seventh, and ninth cell switches 14A, 14C, 14E, 14G, 14I. The second bus 20 electrically connects the second side of the second, fourth, sixth, eighth, and tenth cell switches 14B, 14D, 14F, 14H, 14J are electrically connected together.

The system 10 includes a capacitor 22 for holding a charge corresponding to a voltage of one of the cells 12. The capacitor 22 includes a pair of terminals (not labeled). For convenience, these terminals are referred to hereafter as a positive terminal and a negative terminal. In the illustrated embodiment, the capacitor 22 has a capacitance of 1 µF (micro Farad). One acceptable capacitor 22 is the ECWU1105KCV, manufactured by Panasonic, and rated for 100 volts DC with a capacitance tolerance of ±10%. Of course, other capacitors 22, with varying capacitances and other physical and electrical characteristics, may also be acceptable. The capacitor 22 may be charged by each of the plurality of cells, as described in greater detail below. Therefore, the capacitor 22 is referred to by those skilled in the art as a "flying capacitor".

The system 10 of the illustrated embodiment further includes four bus switches 24, 26, 28, 30 for coordinating charging and isolating the capacitor 22. As with the cell switches 14, each of these bus switches 24, 26, 28, 30 has a first side and a second side. Furthermore, each bus switch 24, 26, 28, 30 is preferably implemented as a pair of MOSFETs, configured in the same fashion as the cell switches 14 described above.

The plurality of bus switches 24, 26, 28, 30 includes a first bus positive switch 24, a second bus positive switch 26, a first bus negative switch 28, and a second bus negative switch 30. The first sides of the first bus positive switch 24 and the first bus negative switch 28 are electrically connected to the first bus 18. The first sides of the second bus positive switch 26 and the second bus negative switch 30 are electrically connected to the second bus 20. The second sides of the first bus positive switch 24 and the second positive switch are electrically connected to the positive terminal of the capacitor 22. The second sides of the first bus negative switch 28 and the second bus negative switch 30 are electrically connected to the negative terminal of the capacitor 22.

The system 10 may also include a ground switch 32. One side of the ground switch 32 is electrically connected to the negative terminal of the capacitor 22 and the other side is electrically connected to ground. Where the system 10 is implemented in a vehicle, the ground is typically the chassis ground. In the preferred embodiment, the negative ground switch 32 is implemented as a BSS145-type MOSFET; however, other suitable MOSFETs may be used. The source of the MOSFET is electrically connected to ground and the drain is electrically connected to the negative terminal of the capacitor 22.

The system 10 also includes a primary analog-to-digital converter (ADC) 34 in communication with the capacitor 22. Said another way, the primary ADC 34 receives a signal that corresponds with the charge (voltage) that is stored on the capacitor 22. More specifically, the primary ADC 34 receives an analog voltage supplied by the capacitor 22 and converts the analog voltage into primary digital voltage data. In the illustrated embodiment, the primary ADC 34 includes an input 36 for receiving the analog voltage and an output 38 for providing a digital signal carrying the primary digital voltage data.

One suitable device for implementing the first primary ADC 34 is an ADS7829IDRBR manufactured by Texas Instruments of Dallas, Tex. The digital signal of this primary ADC 34 has a 12-bit resolution and is presented serially at the output 38.

The system 10 preferably includes an amplifier 40 for amplifying the charge stored on the capacitor 22. The amplifier 40 is electrically disposed between the capacitor 22 and the primary ADC 34. As such, the amplifier 40 receives the analog voltage supplied by the capacitor 22 and produces an amplified analog voltage signal. The amplified analog voltage signal is received by the primary ADC 34. The primary ADC 34 provides the digital signal as described above.

In the illustrated embodiment, the amplifier 40 is an operational amplifier (op-amp) 40. For purposes of convenience, the term op-amp 40 will be used hereafter in place of the term amplifier 40; however, this should not be read as limiting in any way. The op-amp 40 includes two inputs (typically referred to as a non-inverting input an inverting input) (not numbered) and an output (not numbered). In the illustrated embodiment, the op-amp 40 provides an amplified gain from each input to output of 1, otherwise referred to as a unity gain amplifier. One suitable op-amp 40 is an LT1636, available from Linear Technology Corporation of Milpitas, Calif. However, other suitable op-amps 40 or other types of amplifiers 40 may also be implemented.

In the illustrated embodiment, the input 36 of the primary ADC 34 is electrically connected to the output of the op-amp 40. The primary ADC 34 receives the amplified voltage signal at the input 36 and produces the digital signal corresponding to the amplified voltage signal. Therefore, the primary digital voltage data carried by the digital signal proportionally corresponds to the voltage of the capacitor 22 and the cell 12 that charged the capacitor 22.

In the illustrated embodiment, the non-inverting input of the op-amp 40 is electrically connected to the positive terminal of the capacitor 12 and the inverting input of the op-amp 40 is electrically connected to the negative terminal of the capacitor 22. The op-amp 40 amplifies the voltage of the capacitor 22 and produces an amplified voltage signal. The amplified voltage signal is available at the output of the op-amp 40 and proportionally corresponds to the voltage of the capacitor 22, and also, the cell 12 that charged the capacitor 22.

The system 10 further includes a controller 42 for controlling operations of the various components of the system 10. The controller 42 may be a microprocessor, microcontroller, computer, application specific integrated circuit (ASIC), or other similar device known to those skilled in the art. In the illustrated embodiments, the controller 42 is a model 68HC908GR32A microcontroller, manufactured by Freescale Semiconductor, headquartered in Austin, Tex. Of course, other controllers would also be suitable.

The controller 42 is in communication with the primary ADC 34 for receiving the primary digital voltage data from the primary ADC 34. Specifically, in the illustrated embodiments, the controller 42 includes a plurality of inputs and outputs (not numbered). The plurality of inputs including a first measurement input for receiving the primary digital voltage signal. The first measurement input is electrically connected to the output of the primary ADC 34, such that the primary digital voltage data corresponding to the voltage of the capacitor 22 (and each cell 12) is received by the controller 42. As is well known to those skilled in the art, many controllers have one or more internal ADCs. Therefore, in other embodiments (not shown) the primary ADC 34 may be integrated within the controller 42.

A memory 44 is in communication with the controller 42 for storing data. This data includes, but is not limited to, the primary digital voltage data corresponding to the voltage of the each cell 12. The memory 44 may be random access memory (RAM), flash memory, a hard disk, a floppy disk, a compact disc, or any other memory device know by those skilled in the art. Furthermore, the memory 44 may be internal to the controller 42, as is the case with the illustrated embodiment.

In the illustrated embodiment, the controller 42 is in communication with the switches 14, 24, 26, 28, 30, 32 for controlling the operation of the switches 14, 24, 26, 28, 30, 32. With respect to the cell switches 14, four outputs of the controller 42 are preferably electrically connected to a decoder 46. The decoder 46 is preferably a BCD (binary coded digit) to decimal decoder 46, such as a 74HC4028. The preferred decoder 46 includes four inputs electrically connected to the controller 42 and ten outputs (i.e., a first decoder output through a tenth decoder output). Only one output of the decoder 46 is activated based on the BCD provided by the controller 42 to the inputs of the decoder 46. Each of the ten outputs is electrically connected to one of the cell switch operation circuits to operate at least one cell switch 14. In the illustrated embodiments, the first decoder output operates the first cell switch 14A, a second decoder output operates the first and second cell switches 24, a third decoder output operates the second and third cell switches 24, and so on through the tenth decoder output, which operates the ninth and tenth cell switches 24.

In the illustrated embodiment, at least one output of the controller 42 is utilized to control the operation of the bus switches 24, 26, 28, 30. A selector 48 is implemented between the controller 42 and the bus switches 24, 26, 28, 30 to control the bus switches 24, 26, 28, 30. Furthermore, at least one output of the controller 42 is electrically connected to the ground switch 32 to control the operation of the ground switch 32.

The system 10 also includes a secondary ADC 50. The secondary ADC includes an input 52 in electrical communication with at least one of the cells 12. The secondary ADC 50 receives an analog voltage supplied by the cell 12 and converts the analog voltage into secondary digital voltage data. The secondary ADC 50 also includes an output 54 in electrical communication with the controller 42. The secondary ADC 50 produces a secondary digital voltage signal encoding the secondary digital voltage data and sends this secondary digital voltage signal to the controller 42 via one of the measurement inputs.

The controller 42 then has access to both the primary and secondary digital voltage data. The controller 42 compares the primary digital voltage data, which reflects the voltage on the capacitor 22, to the secondary digital voltage data, which reflects the voltage on one of cells 12. More particularly, this comparison is done when the capacitor 22 was charged using the voltage of the cell which is connected to the secondary ADC 50. This allows the controller 42 to verify that the capacitor 22 is providing accurate voltage measurements of the cell 12 that is being measured. Thus, it can be assumed that the capacitor 22 and the primary ADC 36 are providing accurate voltage measurements of the remaining cells 12.

In the illustrated embodiment shown in FIG. 1, the secondary ADC 50 is electrically connected to the first cell 12A. More specifically, the input 52 of the secondary ADC 50 is electrically connected to the first side of the first cell switch 14A. However, the secondary ADC 50 could be electrically connected to any of the other cells 12B-12J or cell switches 14B-14J.

In a first alternative embodiment (not shown), a plurality of secondary ADCs 50 may be implemented, with each secondary ADC 50 electrically connected to a different cell 12. In a second alternative embodiment (not shown), a multiplexer (not shown) may be used to electrically connect a plurality of the cells 12 to the secondary ADC 50. Each of these alternative embodiments provide additional verification that the voltage read from the capacitor 22 is true and accurate. However, each of these alternative embodiments are typically more expensive to implement, due to the need for additional devices. Said another way, using a single secondary ADC 50 to verify voltage measurement of the capacitor 22 is more cost effective than the use of a multiplexed secondary ADC 50 or multiple secondary ADCs 50.

The various components of the system 10 may be mounted on a printed circuit board (PCB), as is well known to those skilled in the art. The PCB is printed, on one or both sides, with a conductive material through a mask. The conductive material electrically connects the various components, such that extensive wiring between the components is not needed. Of course, various other electrical and electronic devices may be utilized in an implementation of the system 10, other than the devices described above. As is well known to those skilled in the art, these devices may include, but are not limited to, resistors, diodes, bipolar-junction transistors (BJTs), and capacitors.

Figure 2:
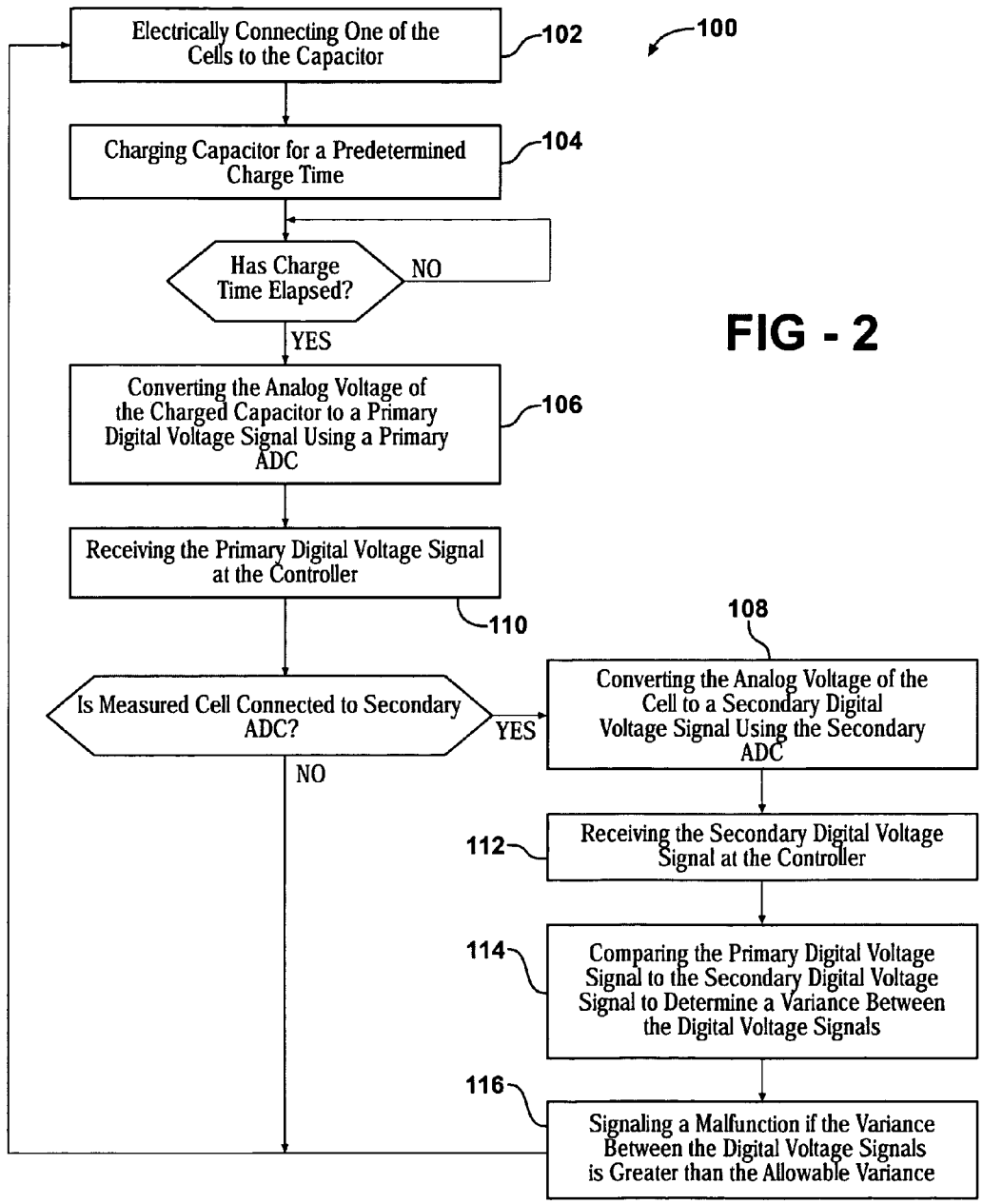
FIG. 2 is a flowchart diagram of an embodiment of a method of measuring voltage of the cells and verifying measurement accuracy.

The functionality, advantages, accuracy, and efficiency of the present invention may be better understood when examining the method 100 of determining the voltage of the cells 12. The method 100 is shown in part in FIG. 2. For convenience, the method 100 is described hereafter in terms of the various components of the system 10. However, the method 100, as described and claimed herein, may be practiced in situations outside of the described system 10.

The method 100 includes the step 102 of electrically connecting one of the cells 12 to the capacitor 22. In the illustrated embodiment of the system 10, the controller 42 operates the various switches 14, 24, 26, 28, 30, 32, based on the selected cell 12, such that the positive terminal of the capacitor 22 is electrically connected to the positive side of the selected cell 12 and the negative terminal of the capacitor 22 is electrically connected to the negative side of the selected cell 12. The controller 42 utilizes the decoder 46 to operate the cell switch 14 or cell switches 14 corresponding to the selected cell 12. The controller utilizes the selector 48 to operate the appropriate bus switches 24, 26, 28, 30.

As an example, when determining a voltage of the first cell 12A, the capacitor 22 must be charged to the voltage of the first cell 12A. Therefore, the first cell switch 14A is closed, while the other cell switches 14B-14J are opened. Since, in the illustrated embodiment, the negative side of the first cell 12A is grounded, the controller closes the ground switch 32. The first bus positive switch 24 and the second bus negative switch 30 are closed while the second bus positive switch 26 and the first bus negative switch 28 are open. Thus, the capacitor 22 will charge to the voltage level of the first cell 12A.

As further examples, when the second cell 12B is selected, the first and second cell switches 14A, 14B are closed, while the other cell switches 14C-14J are opened. The second bus positive switch 26 and the first bus negative switch 28 are closed while the first bus positive switch 24, the second bus negative switch 30, and the ground switch 32 are open. Thus, the capacitor 22 will charge to the voltage level of the second cell 12B. When the third cell 12C is selected, the second and third cell switches 14B, 14C are closed, while the other cell switches 14A, 14D-14J are opened. The first bus positive switch 24 and the second bus negative switch 30 are closed while the second bus positive switch 26, the first bus negative switch 28, and the ground switch 32 are open. Thus, the capacitor 22 will charge to the voltage level of the third cell 12C. Obviously, one skilled in the art may determine the appropriate switches 14 to open and close for each other cell 12 using a similar methodology.

The method 100 continues with the step 104 of charging the capacitor for a predetermined charge time such that the voltage level of the capacitor 22 substantially matches the voltage level of the cell 12 that is being measured. Accordingly, the predetermined charge time is based on the electrical characteristics of the cell 12 and the capacitor 22 and is preferably tracked by the controller 42.

Preferably, in response to the elapsing of the predetermined charge time, the method 100 continues with the step (not shown) of electrically disconnecting the cell 12 from the capacitor 22. Specifically, in the illustrated embodiments of the system 10, the switches 14, 24, 26, 28, 30, 32 are operated such that the capacitor 22 is electrically disconnected from the cells 12 and electrically connected to the input of the primary ADC 34. Preferably, all of the cell switches 12 and the bus switches 24, 26, 28, 30 are opened and the ground switch 32 is closed such that the negative terminal of the capacitor 22 and the inverting input of the op-amp 40 are both grounded.

The method 100 continues by measuring the voltage of the capacitor 22. More specifically, the method 100 includes the step 106 of converting the analog voltage from the charged capacitor 22 to a primary digital voltage signal corresponding to the voltage of the capacitor using the primary ADC 34 in response to the elapsing of the predetermined charge time. If the cell 12 being measured utilizing the capacitor 22 and the primary ADC 34 is the cell 12 that is electrically connected to the secondary ADC 50, the method includes measuring the voltage of that cell 12. Specifically, the method includes the step 108 of converting the analog voltage from the cell 12 to a secondary digital voltage signal corresponding to the voltage of the cell 12 using the secondary ADC 50.

The method also includes the steps 110, 112 of receiving the primary digital voltage signal at the controller 42 and receiving the secondary digital voltage signal at the controller 42. Once both digital voltage signals are received, the method continues with the step 114 of comparing the primary digital voltage signal to the secondary digital voltage signal to determine a variance between the digital voltage signals. If the variance is greater than a predetermined value, i.e., an allowable variance, then that variance is indicative of an error or fault in one of the measurements. Typically, this error or fault is in the measurement of the voltage of the capacitor 22.

The method continues with the step 116 of signaling a malfunction if the variance between the digital voltage signals is greater than the allowable variance. A user of the system, such as a driver of the vehicle which utilizes the system 10 or a technician, is then alerted to a potential problem with the system 10. Without correction, a problem with the system 10 could lead to uneven charging of the cells 12 and abbreviated life of the cells 12.

Alternatively, instead of signaling the malfunction when the voltage reading of the capacitor 22 is greater than the predetermined voltage level, several of the steps may be repeated. For instance, the system may obtain new measurements from both the first and second ADCs 34, 50. If the variance between readings is still greater than the allowed variance, after one or more iterations, then the method 100 could proceed to the signaling step 116.

The system 10 may also include one or more resistive balancing circuits (not shown) for balancing the cells 12, i.e., adjusting the voltage of each cell 12 so that the voltage of each cell 12 is substantially similar. This adjustment of the cells 12 is preferably based on the voltage readings obtained for each cell 12 as described above.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A system of only one capacitor and only one amplifier for measuring voltage of a cell in a plurality of cells connected in series and verifying measurement accuracy for the cell, said system comprising:
    a capacitor for storing a charge of one of a plurality of cells;
    at least one switch electrically connected to said capacitor for selectively connecting the one of the plurality of cells to said capacitor;
    an amplifier electrically connected to said capacitor;
    a primary analog-to-digital converter (ADC) having an input in electrical communication with said amplifier for receiving an analog voltage supplied by said amplifier and converting the analog voltage supplied by said amplifier into primary digital voltage data;
    a secondary ADC having an input in electrical communication with each of the plurality of cells for receiving an analog voltage supplied by the one of the plurality of cells and converting the analog voltage supplied by the one of the plurality of cells into secondary digital voltage data; and
    a controller in electrical communication with the primary ADC and the secondary ADC for receiving the primary digital voltage data and for receiving the secondary digital voltage data, wherein the controller is configured to compare the primary digital voltage data to the secondary digital voltage data to determine whether the primary digital voltage data matches the charge of the one of the plurality of cells.

2. A system as set forth in claim 1 wherein the plurality of cells includes a first cell and said at least one switch includes a first cell switch having a first side and a second side with said first side electrically connected to said first cell.

3. A system as set forth in claim 2 wherein said input of said secondary ADC is electrically connected to said first side of said first cell switch.

4. A system as set forth in claim 1 wherein said secondary ADC is further defined as a plurality of secondary ADCs wherein each of the plurality of secondary ADCs is electrically connectable to at least one of the plurality of cells.

5. A system as set forth in claim 1 further comprising a plurality of resistive balancing circuits for balancing the plurality of cells.

6. A system as set forth in claim 1 further comprising a selector configured to work in coordination with said controller to operate said at least one switch.

7. A system as set forth in claim 1 further comprising a decoder configured to work in coordination with said controller to operate said at least one switch.

8. A method of measuring voltage of individual cells in a plurality of cells connected in series and verifying measurement accuracy utilizing a system including only one capacitor, only one amplifier, a primary analog-to-digital converter (ADC), and a secondary ADC, said method comprising:
    electrically connecting one of the plurality of cells to the capacitor, wherein the one of the plurality of cells comprises a first voltage signal;
    charging the capacitor for a predetermined charge time;
    amplifying the voltage from the charged capacitor using the amplifier;
    converting the voltage from the amplifier to a primary digital voltage signal using the primary ADC;
    converting the voltage from the one of the plurality of cells to a secondary digital voltage signal using the secondary ADC;
    measuring the primary digital voltage signal and secondary digital voltage signal; and
    comparing the measurement of the primary digital voltage signal to the measurement of the secondary digital voltage signal to determine whether the primary digital voltage signal matches the first voltage signal of the one of the plurality of cells.

9. A method as set forth in claim 8 further comprising the steps of receiving the primary digital voltage signal and receiving the secondary digital voltage signal.

10. A method as set forth in claim 8 further comprising the step of signaling malfunction if the variance between the digital voltage signals is greater than an allowable variance.

11. A method as set forth in claim 8 further comprising the step of repeating the previous steps if the variance between the digital voltage signals is greater than an allowable variance.

* * * * *